United States Patent [19]
Pramanick et al.

[11] Patent Number: 6,147,404
[45] Date of Patent: Nov. 14, 2000

[54] DUAL BARRIER AND CONDUCTOR DEPOSITION IN A DUAL DAMASCENE PROCESS FOR SEMICONDUCTORS

[75] Inventors: Shekhar Pramanick, Fremont; Dirk Brown, Santa Clara, both of Calif.; John A. Iacoponi, Austin, Tex.

[73] Assignee: Advanced Micro Devices, Inc., Sunnyvale, Calif.

[21] Appl. No.: 09/317,813

[22] Filed: May 24, 1999

[51] Int. Cl.[7] .................................................... H01L 23/48
[52] U.S. Cl. .......................... 257/751; 257/750; 257/915
[58] Field of Search ................... 257/750, 751, 257/762, 764, 763, 765, 915

[56] References Cited

U.S. PATENT DOCUMENTS

| 5,592,023 | 1/1997 | Oda | 257/750 |
| 5,686,760 | 11/1997 | Miyakawa | 257/751 |
| 5,883,433 | 3/1999 | Oda | 257/750 |
| 6,005,291 | 12/1999 | Koyanagi et al. | 257/751 |

*Primary Examiner*—David Hardy
*Assistant Examiner*—Lourdes Cruz
*Attorney, Agent, or Firm*—Mikio Ishimaru

[57] ABSTRACT

An integrated circuit and a method for manufacturing therefor is provided in which a partial dual damascene deposition is performed to place a barrier, seed, and conductive layer in most of a via between two interconnect channels and then capping the via with a further barrier, seed, conductive layer to prevent electromigration between an interconnect channel and the via.

10 Claims, 2 Drawing Sheets

DUAL BARRIER AND CONDUCTOR DEPOSITION IN A DUAL DAMASCENE PROCESS FOR SEMICONDUCTORS

TECHNICAL FIELD

The present invention relates generally to semiconductors and more specifically to a dual damascene semiconductor and manufacturing method therefor.

BACKGROUND ART

In the process of manufacturing integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

One metalization process, which is called the "damascene" technique starts with the placement of a first channel oxide (dielectric) layer, which is typically a silicon dioxide or oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and a barrier layer is deposited to coat the walls of the first channel opening to ensure good adhesion and to act as a barrier material to prevent diffusion of a conductor (conductive material), such as copper, into the oxide layer and the semiconductor devices (the combination of the adhesion and barrier material is collectively referred to as "barrier layer" herein). A seed layer is then deposited on the barrier layer to form a conductive material base, or "seed", for subsequent deposition of conductive material. The conductive material is then deposited in the first channel openings and subjected to a chemical-mechanical polishing process which removes the first conductive material above the first channel oxide layer and damascenes the conductive material in the first channel openings to form the first conductive channels.

For multiple layers of channels, another metalization process, which is called the "dual damascene" technique, is used in which the channels and vias are formed at the same time. In one example, the via formation step of the dual damascene technique starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel oxide layer is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. A barrier layer is then deposited to coat the via openings and the second channel openings. Next, a seed layer is deposited on the barrier layer. This is followed by a deposition of the conductive material in the second channel openings and the via openings to form the second channel and the via. A second chemical-mechanical polishing process leaves the two vertically separated, horizontally perpendicular channels connected by a cylindrical via.

The use of the damascene techniques eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that barrier layers are required. Materials such as tantalum (Ta), titanium (Ti), and tungsten (W), their alloys, their nitrides, or combinations thereof are used as adhesion/barrier materials for copper. The barrier layers serve several different roles. First, they promote greater adhesion of the copper to the oxide layer. Second, they prevent diffusion of copper into the dielectric layer. And, third, they improve the resistance of copper to electromigration, which is the movement of copper atoms under the influence of current flow, which can cause voids in the copper.

The barrier layer improves the resistance to electromigration in two areas. First, along the length of a conductive channel in the direction of current flow where the barrier layer will be on three sides of the copper and the good interface reduces copper surface electromigration. And, second, in the contact area of a via with the conductive channel where the current density can be five times higher than in the conductive channel itself.

While the barrier layer between the via and the first conductive channel prevents electro-migration when the electron current flows from the second conductive channel through the via to the first conductive channel, when the electron current flows in the reverse direction, electro-migration occurs in the via as the copper migrates into the second conductive channel. This is a major problem since electro-migration causes voids to occur in the via which reduce the cross-sectional area of the via and increase electro-migration until there is an electrical failure between the first and second conductive channels.

Thus, a method for preventing electro-migration in the via, regardless of the direction of current flow, has long been sought but has eluded those skilled in the art. As the semiconductor industry moves from aluminum to copper and other types of materials with greater conductivity and thinner channels and narrower vias, it is becoming more pressing that an answer be found.

DISCLOSURE OF THE INVENTION

The present invention provides a semiconductor device having barrier layers on both top and bottom of conductive vias so as to eliminate electro-migration of conductive material under electron current flow between the top and bottom conductive channels.

The present invention provides a method for forming barrier layers on the top and bottom of conductive vias to prevent electro-migration of conductive materials under current flow from the bottom to top channels.

The present invention provides a semiconductor device having barrier layers on both top and bottom of conductive vias so as to eliminate electro-migration of copper under electron current flow between the top and bottom conductive channels.

The present invention provides a method for forming barrier layers on the top and bottom of conductive vias to prevent electro-migration of copper under electron current flow from the bottom to top channels.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
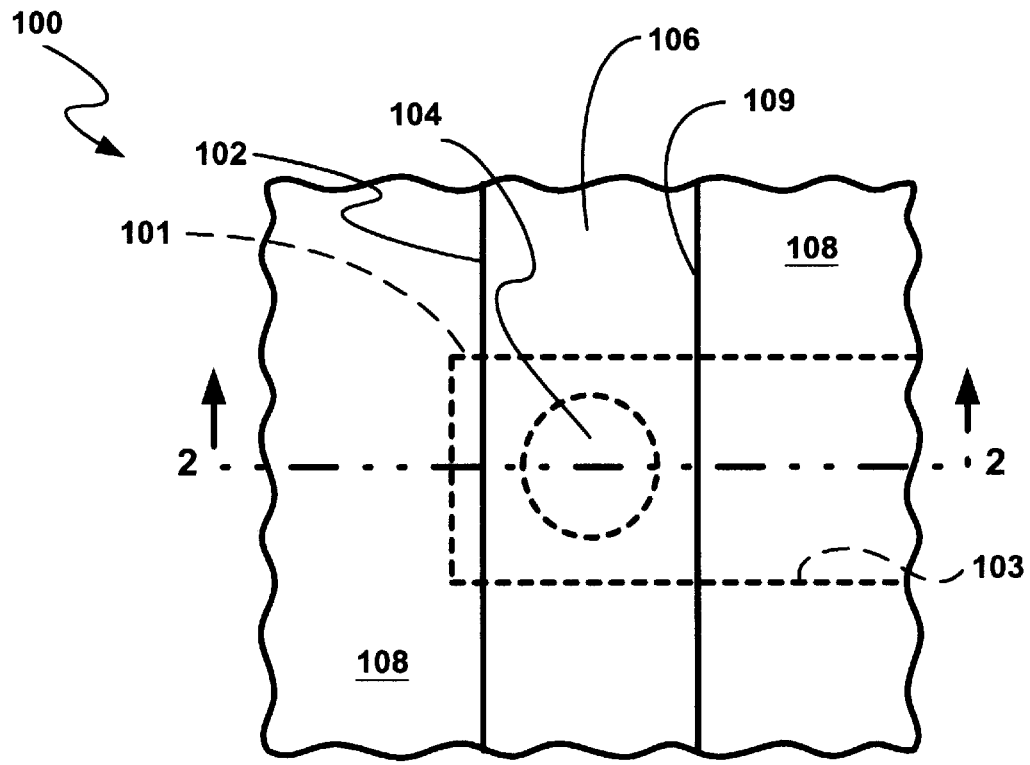
FIG. 1 (PRIOR ART) is a plan view of aligned channels with a prior art via.

Referring now to FIG. 1 (PRIOR ART), therein is shown a plan view of a prior art pair of perpendicularly aligned semiconductor channels of a conductive material such as aluminum or copper disposed on a production integrated circuit 100. A first channel 101 is shown disposed in a first channel dielectric layer 101 in a first channel opening 103 below a second channel 102 which extends substantially perpendicular to the first channel 101 in the plan view. A round via 104 connects the first and second channels 101 and 102 and is a part of the second channel 102 by being deposited by a dual damascene technique. The first channel is of a first conductive material. The second channel 102 is formed by filling a second channel opening 106 disposed in a second channel dielectric layer 108, with a second conductive material. The second channel opening 106 is defined by sidewalls 109 of second channel dielectric layer 108.

Figure 2:
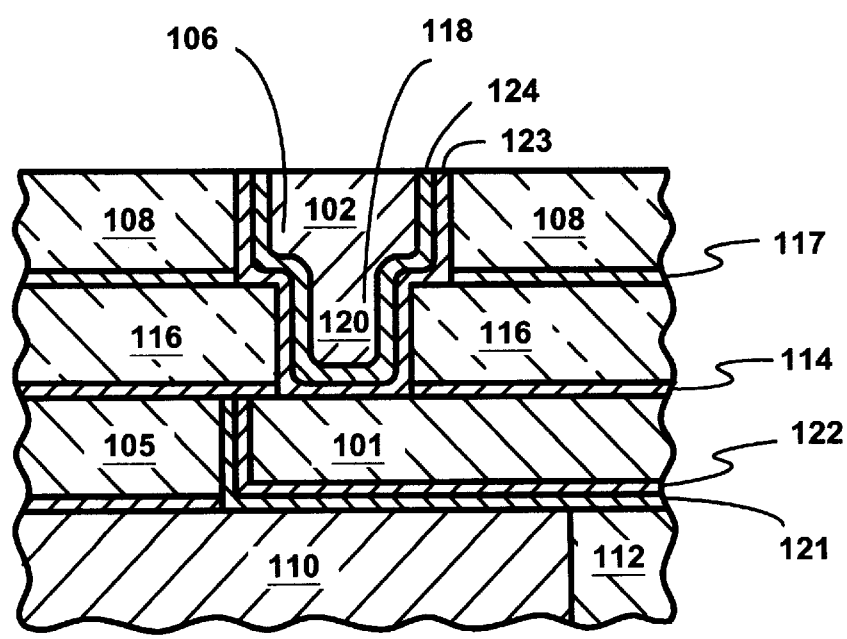
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along 2—2. The first channel 101 is disposed in the first channel dielectric layer 105 over a polysilicon gate 110 and a dielectric layer 112 of a semiconductor device (not shown). The first and second channels 101 and 102 are in horizontal planes separated vertically by an etch stop layer 114, a via dielectric layer 116, and a thin via etch stop layer 117. The cross-sectional area of the round via 104 of FIG. 1 (PRIOR ART) defines a cylindrical via 120 when it is filled with the second conductive material.

Also shown disposed around the first channel 101 are a barrier layer 121 and seed layer 122, and around the second channel 102 and the cylindrical via 120 is a barrier layer 123 and seed layer 124. The barrier layer 123, for copper seed layers and copper or copper alloy conductive materials, is made up of barrier materials such as tantalum, titanium, tungsten, their alloys, compounds thereof (especially nitrides) and combinations thereof. While the present invention uses a single adhesion/barrier layer, it should be understood that layers of different combinations of adhesion, barrier, and adhesion materials are also encompassed.

Figure 3:
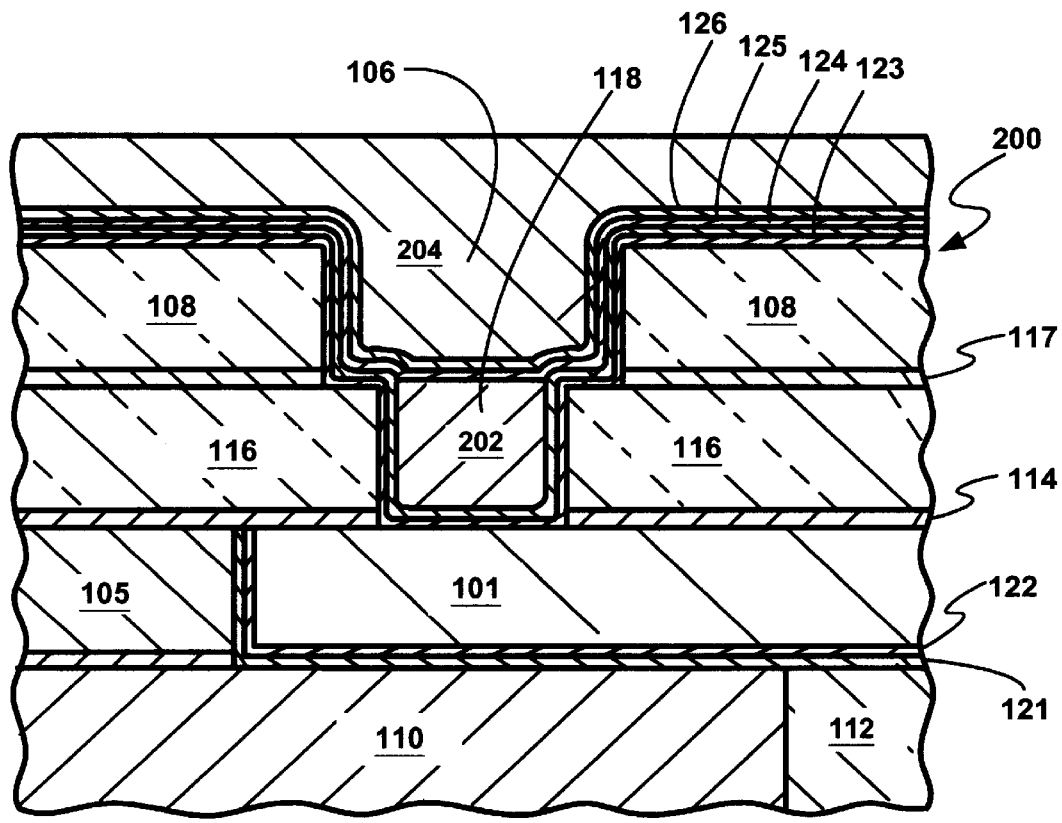
FIG. 3 is a cross-section similar to FIG. 2 (PRIOR ART) during an intermediate stage of processing for the integrated circuit of the present invention.

Referring now to FIG. 3, therein is shown a cross-section similar to FIG. 2 (PRIOR ART) of an integrated circuit 200. A first channel 101 is shown disposed in a first channel dielectric layer 105 over a polysilicon gate 110 and a dielectric layer 112, which are portions of a semiconductor device (not shown). For ease of understanding, the same elements as shown in FIG. 2 (PRIOR ART) are numbered with the same numbers. Disposed vertically above the first channel 101 is an etch stop layer 114, a via dielectric layer 116, a thin via etch stop layer 117, and a second channel dielectric layer 108. The dielectric layers are generally of silicon dioxide and the etch stop layers are of silicon nitride.

Also shown disposed around the first channel 101 are a barrier layer 121 and a seed layer 122. In the preferred embodiment, the barrier layers are made up of barrier materials such as tantalum, titanium, tungsten, their alloys, compounds thereof (especially nitrides), and combinations thereof. The channels are generally of copper, aluminum, polysilicon, gold, silver, alloys thereof, compounds thereof, and combinations thereof.

In FIG. 3, the via opening 118 and second channel opening 106 have been formed and coated with a barrier layer 123 and a seed layer 124. Further, a bottoms-up via-fill of conductive material 202 has been performed. The via-fill fills the via opening 118. A second coat of a barrier layer 125 and a seed layer 126 formed on top of the seed layer 124 and on top of the conductive material 202 in the via opening 118. This is followed by the deposition of conductive material 204 in the second channel opening 106.

Figure 4:
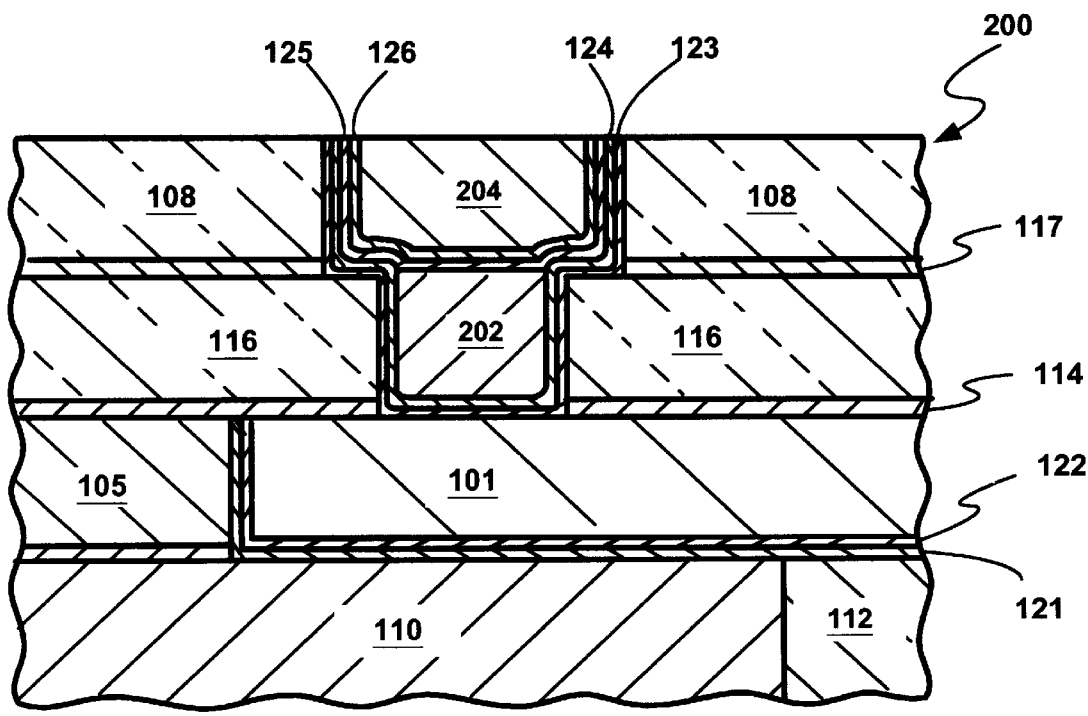
FIG. 4 is the integrated circuit of FIG. 3 after processing in accordance with the present invention.

Referring now to FIG. 4, therein is shown the integrated circuit 200 of FIG. 3 in its completed form. After the two depositions of barrier, seed, and conductive material layers, a chemical-mechanical polishing step is used to remove all the material outside of the second channel opening 106 and to expose the second channel dielectric layer 108 for further processing.

It should be noted that the barrier layer 125 totally stops electromigration among the first and second channels 101 and 204, and the via 101.

In production, a conventional first damascene process is used to dispose a first channel 101 in a first channel dielectric layer 105 above portions of the semiconductor device, the polysilicon gate 110 and the dielectric layer 112, on a production integrated circuit 200. The damascene process is a photolithographic process which uses a mask to define a first channel opening 103 in the first channel dielectric layer 105. The first channel opening is then filled with the barrier layer 121 and the seed layer 122 which line the opening. A first conductive material, such as copper or a copper alloy, is deposited using conventional metal deposition techniques, such as physical vapor deposition, chemical vapor deposition, electroplating, or a combination thereof, to form the first channel 101. The etch stop layer 114, the via dielectric layer 116, and the via etch stop layer 117 would be successively deposited on top of the first channel 101 and the first channel dielectric layer 105 using conventional deposition techniques.

By using the via photoresist and the via photolithographic process followed by nitride etching of the round via 104 in the via etch stop layer 117, the basis for the via opening 118 is formed. There is then a subsequent deposition of the second channel dielectric layer 108.

The second damascene process uses a further mask to define the second channel opening 106 in the second channel dielectric layer 108. Since the second damascene process uses an anisotropic dielectric etch, the etch also forms the via opening 118 down to the etch stop layer 114. The anisotropic dielectric etch etches faster in the vertical direction of FIG. 3 than in the horizontal direction. The nitride etch of the etch stop layer 114 exposes a portion of the first channel 101 and completes the etching steps.

Next, the barrier layer 123 and the seed layer 124 are deposited to line the second channel opening 106 by a process such as physical-vapor deposition or chemical-vapor deposition. The conductive material 202, generally copper or a copper alloy, is deposited by using a conventional bottoms-up via-fill technique.

Next, the deposition of the barrier layer 125 and the seed layer 126 are performed using a conventional deposition technique. The conductive material 204 is similarly deposited using an electroplating technique. Thereafter, the conductive material 204, the seed layer 126, the barrier layer 125, the seed layer 124, and the barrier layer 123 are chemical-mechanical polished away until the second channel dielectric layer 108 is exposed.

Thus, the resulting structure may be described as a dual barrier and conductor deposition for dual damascene process for semiconductors. With the approach of the present invention, the conductive via is enclosed between two diffusion barriers so the via behaves as a tungsten via in aluminum technology. Any electro-migration void is thus formed only in the trench areas. Electro-migration lifetime is improved since current density in the channel is significantly lower than in the via.

Those skilled in the art would understand that the figures herein do not show relative or actual thicknesses. The barrier layer 125, while less conductive than the conductive material, does not substantially affect the ability of the via or channel to conduct electricity.

While the best mode utilizes copper as the conductive material, it should be understood that the present invention is applicable to other conductive materials such as copper, aluminum, silver, gold, alloys thereof, compounds thereof, and combinations thereof Similarly, the barrier layer can be of tantalum, titanium, tungsten, alloys thereof, compounds thereof (especially nitrides), and combinations thereof.

Further, although the embodiments of the present invention are directed to using the dual damascene technique, it also will be recognized by those skilled in the art that other techniques of forming interconnect, such as the single damascene technique, or other traditional techniques of forming low resistance contacts or plugs which involve filling an opening with conductive materials such as tungsten or aluminum may be used to practice the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. An integrated circuit, comprising:

a semiconductor device;

a first dielectric layer formed over said semiconductor device;

a conductive material disposed in said first dielectric layer in contact with said semiconductor device;

a second dielectric layer disposed over said first dielectric layer;

a barrier layer defining a via in said second dielectric layer, said barrier layer in contact with said conductive material;

a seed layer lining said barrier layer;

a second conductive material over said seed layer in said via and substantially filling said via;

a second barrier layer over said second conductive material, said barrier layer defining a channel in said second dielectric layer;

a second seed layer lining said second barrier layer; and a third conductive material over said second seed layer and filling said channel in said second dielectric layer.

2. The integrated circuit as claimed in claim 1 including:

a first barrier layer under said conductive material; and a seed layer disposed between said first barrier layer and said conductive material.

3. The integrated circuit as claimed in claim 1 wherein said barrier layers use materials selected from a group consisting of tantalum, titanium, tungsten, alloys thereof, compounds thereof, and combinations thereof.

4. The integrated circuit as claimed in claim 1 wherein said seed layers use materials selected from a group consisting of copper, aluminum, silver, gold, alloys thereof, compounds thereof, and combinations thereof.

5. The integrated circuit as claimed in claim 1 wherein said conductive materials use materials selected from a group consisting of copper, aluminum, silver, gold, alloys thereof, compounds thereof, and combinations thereof.

6. An integrated circuit, comprising:

a semiconductor device;

a first dielectric layer formed over said semiconductor device;

a conductive material disposed in said first dielectric layer in contact with said semiconductor device;

a via dielectric layer disposed over said first dielectric layer, said via dielectric layer having a via opening provided therein and open to said conductive material;

a second dielectric layer formed over said via dielectric layer, said second dielectric layer having an opening provided therein and open to said via opening;

a barrier layer lining said via opening and said opening in said second dielectric layer, said barrier layer in contact with said conductive material;

a seed layer lining said barrier layer;

a second conductive material over said seed layer in said via opening substantially filling said via opening;

a second barrier layer over said second conductive material;

a second seed layer lining said second barrier layer; and a third conductive material over said second seed layer and filling said opening in said second dielectric layer.

7. The integrated circuit as claimed in claim 6 including:

a first barrier layer under said conductive material; and a seed layer disposed between said first barrier layer and said conductive material.

8. The integrated circuit as claimed in claim 6 wherein said barrier layers use materials selected from a group consisting of tantalum, titanium, tungsten, alloys thereof, compounds thereof, and combinations thereof.

9. The integrated circuit as claimed in claim 6 wherein said seed layers use materials selected from a group consisting of copper, aluminum, silver, gold, alloys thereof, compounds thereof, and combinations thereof.

10. The integrated circuit as claimed in claim 6 wherein said conductive materials use materials selected from a group consisting of copper, aluminum, silver, gold, alloys thereof, compounds thereof, and combinations thereof.

* * * * *